May 10, 1966 D. J. FARMER 3,251,003

FREQUENCY SYNTHESIZER ARRANGEMENT FOR PROVIDING OUTPUT SIGNALS COHERENT WITH INPUT SIGNALS FROM A FREQUENCY STANDARD

Filed July 31, 1963 2 Sheets-Sheet 1

INVENTOR.
Donald J. Farmer
BY Fraser and Bogucki
Attorneys

FREQUENCY SYNTHESIZER ARRANGEMENT FOR PROVIDING OUTPUT SIGNALS COHERENT WITH INPUT SIGNALS FROM A FREQUENCY STANDARD

Filed July 31, 1963 2 Sheets-Sheet 2

INVENTOR.
Donald J. Farmer
BY Fraser and Bogucki
Attorneys

United States Patent Office 3,251,003 Patented May 10, 1966

3,251,003

FREQUENCY SYNTHESIZER ARRANGEMENT FOR PROVIDING OUTPUT SIGNALS COHERENT WITH INPUT SIGNALS FROM A FREQUENCY STANDARD

Donald J. Farmer, Pacific Palisades, Calif., assignor, by mesne assignments, to GTC Corporation, a corporation of Texas Filed July 31, 1963, Ser. No. 298,986
7 Claims. (Cl. 331—25)

This invention relates to signal generating equipment and more particularly to an arrangement and methods for developing coherent output signals at predetermined frequencies from a frequency standard source.

Present day communication systems, navigation systems, and the like depend to a considerable extent on extremely stable and accurate electrical signals for communication, timing, distance measurement and similar purposes. In such uses, it is particularly important to maintain the frequency of particular signals virtually constant, since the accuracy of the timing and other measurements being made depends upon the signal frequency. Various frequency standards, in particular those dependent upon an atomic resonance frequency, are almost entirely unaffected by environmental factors and therefore are capable of providing a fixed and precisely known reference point in the radio frequency spectrum. It is usually essential, however, to be able to provide electrical signals at selected frequencies which differ from the frequencies generated by available atomic frequency standards but with the same degree of accuracy and stability.

The purpose of a frequency synthesizer is to convert a signal at one specified frequency to a signal at one or more preferred frequencies different from the first. Based on mathematical principles alone, it can be seen that such a conversion can always be accomplished in at least one way, i.e., by the straightforward generation and translation of frequencies through multiplication, division and intermixing of signals at suitable frequencies. However, practical considerations severely limit the possible configurations of frequency conversion arrangements. The overriding consideration is usually the control of spurious signals which occur coincident with the synthesized output signal. For example, configurations requiring the generation of high order harmonics of an available signal should be avoided because selection of the desired signal from adjacent harmonics requires a tuned circuit of high Q which is very likely to be critical in adjustment. Intermixing of two signals to produce sum and difference frequencies followed by filtering to select a particular desired frequency is a common operation; however, if the desired frequency is close in value to either of the inputs or to other of the intermixing products its isolation may be difficult by conventional filtering techniques.

Generalized methods are known which can be followed to produce output signals at any desired frequency from input signals at one or more available frequencies. Using such methods, it is possible to develop desired output signals which, by virtue of their being synchronized with the input signals which may be derived from an atomic frequency standard, provide the desired accuracy and stability of the frequency standard. Arrangements developed in accordance with such methods do not, however, insure the most practical frequency synthesizer, either from the standpoint of realizability or from the standpoint of providing an output which is free from spurious signals and other possible interference mentioned above, nor are such arrangements likely to be particularly compact and rugged or to possess the other operational characteristics which are desirable in an ultra-stable precision signal generator. Moreover, such methods are likely to break down completely when it is desired to provide a frequency synthesizer capable of developing output signals in various frequency steps over a particular range of frequencies.

For timing purposes in distance measurement as performed by radar systems, a frequency of 81.959 kc. (kilocycles per second) is particularly desirable. This particular frequency is related to the velocity of electromagnetic radiation in free space and is extremely useful as a source of accurate timing pulses for converting elapsed time into yards for a radar display. The velocity of electromagnetic radiation in the atmosphere is slightly different from the velocity in free space and therefore it is necessary to provide a frequency of 81.96427 kc. for the generation of timing pulses for the same purpose in terrestrial radar. Where a radar system may be used alternatively in tracking devices either within or outside of the atmosphere or where the same frequency standard is to be used in conjunnction with one or more radar systems for various tracking purposes, it is desirable to be able to select one or another of the specified frequencies as needed. Moreover, in a frequency synthesizer which is arranged to provide the specified plurality of output signal frequencies, it may be desirable to have the synthesizer tunable over a frequency range which encompasses the specified frequencies.

It is, therefore, a general object of this invention to provide an improved frequency synthesizer arrangement capable of providing selected output signal frequencies in synchronism with a given input signal.

It is an object of the present invention to provide such a frequency synthesizer which is tunable over a particular frequency range to provide a selected one of a range of output signals, each of which is coherent with an applied input signal.

Specifically, it is an object of the present invention to provide a frequency synthesizer capable of generating output signals at frequencies of 81.959 kc. or 81.96427 kc., as selected, from applied input signals such as may be available from an atomic frequency standard.

It is a further object of the present invention to provide a frequency synthesizer capable of providing the specified output signal frequencies in a configuration which is simple and compact in circuit arrangement, but which is rugged and reliable in operation.

In brief, the present invention utilizes a voltage controlled oscillator coupled in a phase-locked loop in conjunction with a variable frequency divider. The generated signal is maintained coherent with an input signal received from a frequency standard by continuous comparison in a phase detector. The signal from the voltage controlled oscillator is further processed by suitable division and mixing with a signal from the frequency standard to produce the desired output signal at the selected frequency. The output signal may be varied in one-cycle-per-second steps over a range from 81.954 kc. to 81.964 kc. by selection of the appropriate division factor in the variable frequency divider which is coupled in the phase-locked loop. In addition, in accordance with an aspect of the invention, an output signal at 81.96427 kc. is available simply by selecting a particular division factor in the variable frequency divider in the phase-locked loop and by changing slightly the division factor in a frequency divider which operates on one of the input signals from the frequency standard. In accordance with a further aspect of the invention, a second phase detector is arranged to provide a lock indication signal, which may be in the form of a signal light, to indicate to an operator when the frequency synthesizer is in lock, thus insuring that the output signal is in synchronism with the input signals from the frequency standard.

In one particular arrangement of a frequency synthesizer in accordance with the present invention, a circuit is provided which is arranged to operate in conjunction with input signals of 100 kc. and 1 mc. (megacycle per second). The output signals in the frequency range from 81.954 kc. to 81.964 kc. are exact, to the same degree of accuracy provided by the applied input signal, in the sense that all further significant digits are 0. It may be pointed out however, that, as opposed to the other output signals, 81.96427 kc. signal is not exact in the same sense but rather the frequency of this output is, more closely, 81.964270152 kc. This differs by only 1.8 parts in 1 billion from the exact value of 81.96427 kc., an error far less than the uncertainty in the propagation velocity of electromagnetic waves.

The present invention may be employed with any suitable frequency standard as the source of the specified input signals. Where extreme accuracy and stability are desired an atomic resonance frequency standard or similar standard may be used. For example, one commercially available rubidium frequency standard generates the specified input frequencies with an accuracy of 1 part in 10 billion, long term stability rating, and is thus particularly suited for use with the present invention.

A better understanding of the present invention may be gained from a consideration of the following detailed description, taken in conjunction with the accompanying drawings, in which.

Figure 1:
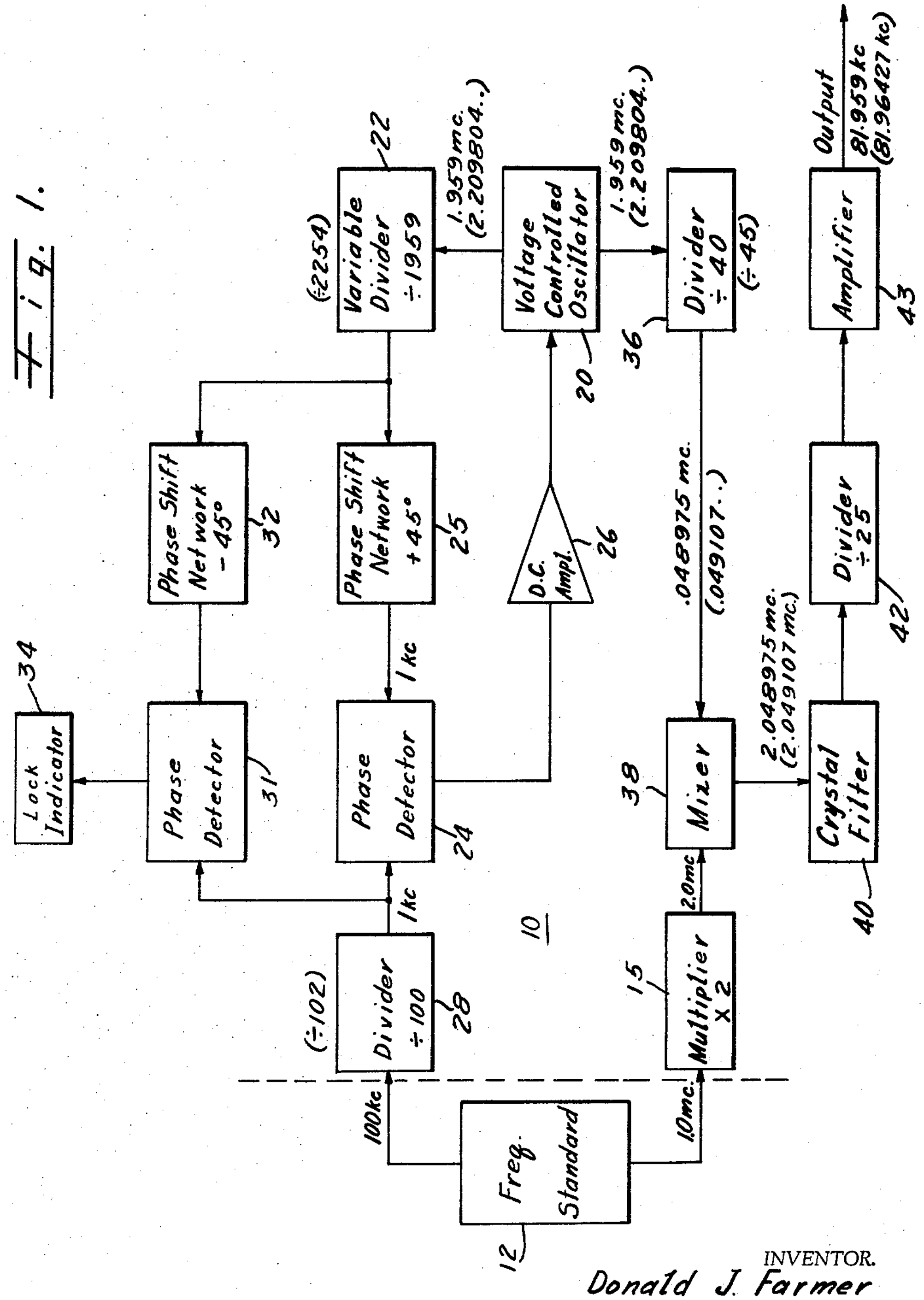
FIG. 1 is a block diagram of one particular arrangement in accordance with the invention.

In FIG. 1, a particular frequency synthesizer 10 is shown coupled to a frequency standard 12 which, in this particular arrangement, provides input signals to the frequency synthesizer 10 at frequencies of 100 kc. and 1.0 mc. The 1.0 mc. signal is directed to a multiplier 15 in order to provide a signal of 2.0 mc. for mixing with signals derived from other portions of the circuit. It will be apparent that the desired 2.0 mc. signal may be derived directly from the signal at 100 kc. if the latter is the only signal available from the frequency standard 12 or, conversely, that the desired 100 kc. signal may be derived directly from the signal at 1.0 mc. if that is the only signal available from the frequency standard.

The frequency synthesizer 10 includes a voltage controlled oscillator 20 utilizing a circuit known in the art which is capable of generating an alternating signal which is variable over a given frequency range in accordance with the amplitude of a D.C. control signal applied to its input. The voltage controlled oscillator 20 is shown having a pair of individual but identical outputs. One output of the voltage controlled oscillator 20 is shown applied to a variable frequency divider stage 22 which supplies a signal to a phase detector 24 via a phase shift network 25 which is arranged to provide a +45° phase shift to the signal passed therethrough. A D.C. amplifier 26 is shown coupled in a feedback loop from the phase detector 24 to the voltage controlled oscillator 20. The oscillator 20, the frequency divider 22, the phase shift network 25, the phase detector 24 and the D.C. amplifier 26 comprise a phase-locked loop which insures that the voltage controlled oscillator 20 oscillates at a selected frequency determined by the division factor setting of the variable divider 22 and in synchronism with a second input applied to the phase detector 24 as a reference. This reference input is derived from the 100 kc. signal of the frequency standard 12 via the frequency divider 28. A second phase detector 31 and phase shift network 32 are shown coupled in parallel with the phase detector 24 and phase shift network 25. The output of the phase detector 31 is applied to a lock indicator 34.

The second output of the voltage controlled oscillator 20 is directed to a frequency divider 36 from which a signal is applied to a mixer stage 38 for mixing with the 2.0 mc. signal from the multiplier 15. The output of the mixer stage 38 is directed to a crystal filter 40 which is arranged to pass a signal having a frequency corresponding to the sum of the two signals applied to the input of the mixer 38 to a frequency divider 42 which in turn is connected to an amplifier 43 which serves as the output stage of the frequency synthesizer 10. In this particular arrangement of the invention, the frequency divider 42 is fixed to provide division by a factor of 25. The frequency dividers 28 and 36 are set, in one mode of operation of the circuit, to provide frequency divisions by factors of 100 and 40 respectively. In a second mode of operation of the circuit, the dividers 28 and 36 are shifted to provide factors of division of 102 and 46 respectively. The variable frequency divider 22 is arranged, in the first mode of operation of the circuit, to provide a selectable factor of division in the range from 1954 to 1964 inclusive. In the second mode of operation of the circuit, the variable frequency divider 22 is set to provide a division factor of 2254. In FIG. 1, the various values indicated in conjunction with the different portions of the diagram indicate factors of division or frequencies which pertain in the respective modes of operation of the circuit. Those values shown without parentheses pertain to the first mode of operation whereas those values shown within parentheses pertain to the second mode of operation of the circuit. Moreover it should be kept in mind that, whereas the particular factor 1959 is shown as representing the first mode of operation for the variable frequency divider 22, this is merely an example and the variable frequency divider 22 is actually variable over the range from 1954 to 1964 inclusive.

The various blocks shown in FIG. 1 correspond to individual circuits which are known in the art. Accordingly, it is not considered necessary to describe such circuits in further detail.

In the first mode of operation of the frequency synthesizer 10 represented in FIG. 1, the 100 kc. input signal is divided in frequency by a factor of 100 in the frequency divider 28 to produce a 1 kc. reference input signal to the phase detector 24. The other phase detector input is obtained by frequency dividing the output of the voltage controlled oscillator 20. An error signal proportional to the phase difference between the two input signals to the phase detector 24 is applied to the voltage controlled oscillator 20 in such a way as to always decrease the phase difference detected by the detector 24. Thus the signals applied to the phase detector 24 are controlled to be at the same frequency and in identical phase; accordingly the output frequency of a voltage controlled oscillator 20, in this mode of operation, is equal to 1 kc. times the division factor selected in the variable frequency divider 22. For the division factor indicated in FIG. 1, the voltage controlled oscillator 20 operates at 1.959 mc. The output frequency of the voltage controlled oscillator is applied to the frequency divider 36 where it is divided by a factor 40 to provide, in the example shown, a signal at .048975 mc. This is mixed with a 2.0 mc. signal in the mixer 38 and the sum frequency of the two mixed signals, equal to 2.048975 mc., is selected by the crystal filter 40 and divided by a factor of 25 in the divider 42 to produce the output frequency of the synthesizer 10. For the case shown in the first mode of operation, this output frequency is 81.959 kc.

With the voltage controlled oscillator and variable frequency divider connected in a phase-locked loop as shown in the particular arrangement of the invention appearing in FIG. 1, the setting of the variable frequency divider 22 controls the output of the voltage controlled oscillator 20 to be a corresponding multiple of the reference frequency applied to the left-hand side of the phase detector 24. It will be appreciated that if the division factor of the variable frequency divider 22 is increased by 1, the output frequency of the frequency synthesizer 10 will be increased by 1 cycle per second. This results from the fact that the output of the voltage controlled oscillator 20 is divided by 1000 (40×25) in the frequency dividers 36 and 42 in passing to the output of the frequency synthesizer 10. Thus to obtain the desired range of one-cycle-per-second increments in the output frequency over the range of 81.954 to 81.964 kc., the division factor of the variable frequency divider 22 is made selectable in unit steps between 1954 and 1964.

In order to provide an indication to an operator as to whether the voltage controlled oscillator 20 is generating a coherent signal or not, a second phase detector 31 and phase shift network 32 are provided in parallel with the phase detector 24 and phase shift network 25. The phase shift network 25 is included in the phase-locked loop ahead of the phase detector 24 in order to develop a total phase shift of 90 degrees from the input of the phase detector 24 to the input of the phase detector 31 in a simple manner. Since the phase shift network 25 provides a +45° phase shift for signals passing therethrough, the signal at the input to the network 25 lags the signal at the input to the phase detector 24 by 45°. The additional phase shift provided by the network 32 results in the presentation of two quadrature signals at the input to the phase detector 31. Under such conditions, the rectified output of the phase detector 31 is the maximum D.C. voltage that can be developed. The presence of this D.C. voltage applied to the lock indicator 34 provides an indication, which may be in the form of an energized panel light, that the phase-locked loop is in lock and therefore that the output signals from the synthesizer are coherent with the reference input from the frequency standard 12. Should the loop consisting of the voltage controlled oscillator 20, the variable divider 22, the phase shift network 25, phase detector 24 and D.C. amplifier 26 not be in lock, the signals applied to the phase detector 31 will no longer be in quadrature (their phase difference will, in fact, be varying) and the output of the phase detector 31 will drop below the threshold of energization of the lock indicator 34, thus serving to warn the operator of the lack of coherence between input and output of the frequency synthesizer 10. The phase shift networks 25 and 32 need not necessarily be placed as shown; any arrangement which causes the inputs to the phase detector 31 to be in quadrature when the loop containing the phase detector 24 is in lock will provide the described result.

A second mode of operation is incorporated in the arrangement of the invention appearing in FIG. 1 which provides a fixed output of 81.96427 kc. To obtain this output frequency, the division factors of the dividers 22, 28, and 36 are changed to accord to the division factors shown in parentheses. Thus the divider 28 serves to divide the 100 kc. input signal by 102 to produce a reference signal of 980.39215 . . . cycles per second as the reference frequency for the phase detector 24. With the variable frequency divider 22 set for a division by 2254, the voltage controlled oscillator 20 is controlled to produce a signal at 2.209804 . . . mc. This is divided by 45 in the divider 36, becoming .049107 . . . mc. which, when mixed with the 2.0 mc. signal in the mixer 38, develops a sum frequency signal of 2.049107 mc. It will be noted that this last mentioned frequency is very close to the frequency of 2.048975 mc. which is developed by the mixer 38 in the first mode of operation of the synthesizer 10. Accordingly the two frequencies developed by the mixer 38 for the respective modes of operation of the synthesizer are within the pass band of the crystal filter 40 which is thus enabled to function in the same fashion in both modes of operation. Division of the output of the crystal filter 40 by 25 in the divider 42 provides an output signal of 81.96427 kc. in the second mode of operation which is useful as a source of radar display timing pulses for distance measurements within the atmosphere. In accordance with the invention described, however, the same frequency synthesizer may provide, in the first mode of operation, an output frequency of 81.959 kc. which may be used as a source of radar display timing pulses for distance measurement in free space. Furthermore, by virtue of the variable division factors which are available in the variable divider 22, the output frequency of the synthesizer in the first mode of operation may be varied in one-cycle-per-second increments over a selected range encompassing the frequency of 81.959 kc.

Considering that the operation of the variable frequency divider 22 in controlling the frequency of the voltage controlled oscillator 20 in the phase-locked loop of the frequency synthesizer 10 is, in effect, a multiplication by the selected division factor of the reference frequency applied to the left-hand input of the phase detector 24, the operation of the frequency synthesizer 10 in one particular mode can be expressed mathematically as processing the reference frequency of 1 kc. in accordance with the expression $$\frac{1\text{ kc.}\times\frac{1959}{40}+2000\text{ kc.}}{25} \qquad (1)$$

to produce an output frequency of 81.959 kc. More generally, where the division factor of the variable frequency divider 22 is selected from unit increments in the range from 1954 to 1964, the operation of the frequency synthesizer 10 may be considered as processing the reference frequency of 1 kc. in accordance with the expression $$\frac{1\text{ kc.}\times\frac{X}{40}+2000\text{ kc.}}{25} \qquad (2)$$

where X is the division factor of the frequency divider 22. Operation in accordance with the expression (2) results a in selected output frequency which is variable in one-cycle-per-second increments over a range from 81.954 kc. to 81.964 kc. Where the reference frequency of 1 kc. that is applied to the phase detector 24 is obtained, as indicated, by division by a factor of 100 in the frequency divider 28 of an input standard frequency of 100 kc., the expression (1) becomes as follows:

$$\frac{100\text{ kc.}\times\left(\frac{1}{100}\times\frac{1959}{40}\right)+2020\text{ kc.}}{25} \qquad (3)$$

When the frequency synthesizer 10 is arranged to operate in its second mode, wherein the factors of division in the dividers 22, 28 and 36 are set at prescribed values different from those existing in the first mode, operation corresponds to processing of the input standard frequency of 100 kc. in accordance with the mathematical expression $$\frac{100\text{ kc.}\times\left(\frac{1}{102}\times\frac{2254}{45}\right)+2000\text{ kc.}}{25} \qquad (4)$$

resulting in an output frequency of 81.96427 kc. which is coherent with the input frequency of 100 kc.

Figure 2:
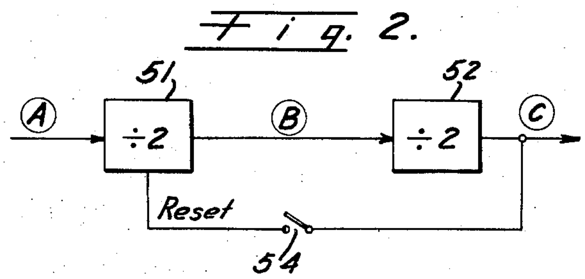
FIG. 2 is a block diagram of a variable frequency divider included for the purpose of illustrating the operation of particular portions of the arrangement of FIG. 1.

Each of the frequency dividers employed in the arrangement of the invention as shown in FIG. 1 may comprise a number of series-connected binary counters with reset feedback appropriate to the desired division factor. A change in the division factor in such an arrangement is effected by changing the reset feedback paths. An example of such a divider in simplified form, presented for purposes of illustration, is shown in FIG. 2 with corresponding waveforms being presented in FIG. 3. In FIG. 2 a pair of binary stages 51 and 52 are shown in a two-stage binary divider with a reset path via a switch 54 extending from the output of the stage 52 to the stage 51.

Figure 3:
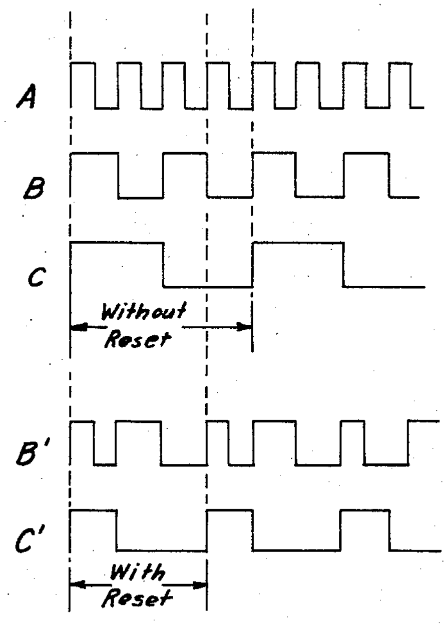
FIG. 3 is a group of waveforms encountered at various points in the diagram of FIG. 2.

In FIG. 3 waveforms A, B, and C represent voltages present at the points A, B, and C respectively in FIG. 2 with the switch 54 in the open position as shown, so that the circuit operates without reset pulses. Waveforms B′ and C′ represent the voltages present at the points B and C with the switch 54 closed to complete the reset feedback path.

Figure 4:
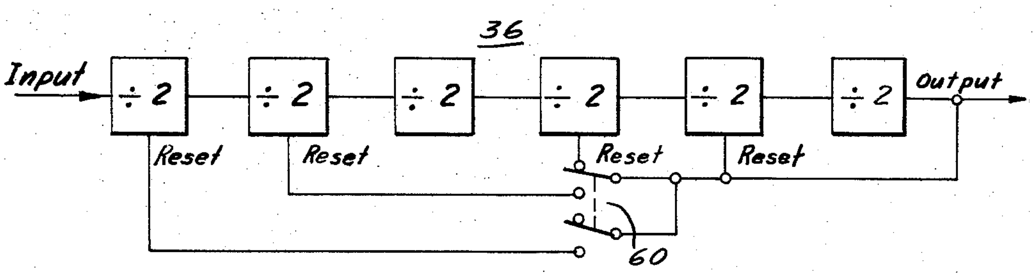
FIG. 4 is a block diagram of one particular portion of the arrangement shown in FIG. 1.

With the switch 54 open, the stages 51 and 52 operate in conventional fashion to divide the frequency of pulses applied at their respective inputs in binary fashion. Thus the application of a pulse train at point A results in a division by 4 through the two stages 51 and 52 to produce one complete cycle at the point C for each four cyles of input pulses at the point A. With the switch 54 closed, however, so that a pulse at the point C is fed back to reset the stage 51, the division factor of the circuit is changed. The application of a reset pulse via the switch 54 produces an effect corresponding to the application of a pulse at the input A. Assuming normal delay in the response of the stage 51 upon receipt of the reset pulse, the waveform B′ is produced at the point B of FIG. 2. In effect, one cycle of the input pulse chain is subtracted from the number required to produce a complete cycle of output pulses. Thus the factor of division is shifted from 4 to 3 in the case illustrated. If the reset pulses were applied to the second stage 52, two input pulses would be subtracted from the number required to drive the ouput through one complete cycle. Therefore, it can be understood how the factors of division in the various dividers such as 22, 28 and 36 in the frequency synthesizer 10 of FIG. 1 may be varied as desired and, if need be as in divider 22, in unit increments in order to produce the desired shift of frequency division. For example, the diagram of FIG. 4 illustrates one particular arrangement which may be employed in the divider 36 of FIG. 1 to produce division by a factor of either 40 or 45 depending upon the position of the switch 60. Without any reset pulses, the arrangement of FIG. 4 comprises a conventional 6-stage divider providing division by 64. A reset pulse applied to the fifth stage as shown has the effect of subtracting 16 from the factor of division. With the switch 60 in the position shown, reset pulses are applied to the fourth and fifth stages to provide a division factor of 64–24, or 40. With the switch 60 in the lower position, so that reset pulses are applied from the output to the first, second and fifth binary division stages, the frequency divider 36 provides a division factor of 64—19, or 45.

Switching arrangements of a similar nature provide for obtaining the increments between 1954 and 1964 with the additional choice of 2254 for the variable frequency divider 22 (FIG. 1) and for obtaining a division factor of either 100 or 102 in the frequency divider 28.

The above-described frequency synthesizer in accordance with the present invention continuously develops particular desired output signals in synchronism with an applied input from a frequency standard so that the accuracy and stability of the frequency standard are present in the output signal frequencies. By virtue of the present invention, the output signal may be selected at a particular frequency corresponding to a distance conversion factor related to the propagation velocity of electromagnetic radiation in either free space or in the earth's atmosphere. In addition, a range of frequencies selectable in one-cycle-per-second increments is available for other uses as desired. The invention may be realized in a compact and reliable arrangement which includes a circuit for providing an indication to an operator in the event of any drift in the frequency generating portion of the arragnement. In the event that only a single fixed output frequency is needed (for example 81.96427 kc.), the respective frequency dividers may be provided with a fixed division factor. thus simplifying the over-all arrangement.

Although there has been described above one specific arrangement of a frequency synthesizer in accordance with the invention for the purpose of illustrating the manner in which the invention may be used to advantage, it will be appreciated that the invention is not limited thereto. Accordingly, any and all modifications, variations or equivalent arrangements falling within the scope of the annexed claims should be considered to be a part of the invention.

What is claimed is:

1. A frequency synthesizer arrangement comprising a controllable oscillator, a variable frequency divider and a first phase detector coupled in a closed loop feedback arrangement for controlling the frequency of the controllable oscillator, means for applying a standard frequency signal to the phase detector for providing a comparison with a signal derived from the controllable oscillator by the variable frequency divider, means connected to an output of the controllable oscillator for mixing a signal frequency derived from the output of the controllable oscillator with another signal frequency derived from the standard frequency signal to provide a signal coherent with the standard frequency signal at a predetermined frequency selectable in accordance with the setting of the variable frequency divider, a second phase detector in parallel with said first phase detector, and indicating means coupled to the second phase detector for providing an indication when the controllable oscillator is developing a signal at the selected frequency.

2. A frequency synthesizer arrangement comprising a voltage controlled oscillator, a first frequency divider coupled to the voltage controlled oscillator for dividing by 2254, a second frequency divider coupled to receive a standard frequency signal of 100 kc. for dividing the standard frequency by 102, a phase detector coupled to receive signals from the first and second frequency dividers for developing a voltage to control the frequency of the voltage controlled oscillator in accordance with the relative phase of said signals, a third frequency divider coupled to the output of the voltage controlled oscillator for dividing by 45, a frequency mixer coupled to receive a standard frequency signal at 2.0 mc. and a signal from the third frequency divider, means connected to the output of the mixer for selecting the sum frequency signal from the mixer, and means for dividing the frequency of the signal from the mixer by 25 to provide an output signal at 81.96427 kc. in synchronism with the standard frequency signals.

3. A frequency synthesizer arrangement for providing output signals coherent with input signals from a frequency standard and related to the propagation of velocity of electromagnetic radiation in free space or in the atmosphere, said output signals being selectable in frequency to provide a conversion to yards from the propagation velocity of electromagnetic radiation in either free space or in the atmosphere comprising: a controllable oscillator; a first frequency divider coupled to receive an input signal from the frequency standard and a second frequency divider coupled to receive an output from the controllable oscillator, said first and second frequency dividers being settable at respective division factors which establish a common submultiple frequency; phase comparing means connected to receive the common submultiple frequency signals from the first and second frequency dividers and to control said oscillator to maintain a substantially constant predetermined phase relationship therebetween; a third frequency divider connected to the output of the controllable oscillator and settable at a division factor which establishes a submultiple frequency which when added to a signal derived from said frequency standard provides a signal at 25 times the frequency of the desired output signal related to the propagation velocity of electromagnetic radiation in free space or in the atmosphere; frequency mixing means connected to receive as inputs, signals from the frequency standard and from said third frequency divider and to provide an output which is the sum of its two input signal frequencies; and a fourth frequency divider having a division factor of 25 connected to the output of the frequency mixing means for providing said desired output signal.

4. A frequency synthesizer arrangement in accordance with claim 3 wherein said first frequency divider is set to provide a division factor of 100 for developing a 1 kc. submultiple frequency from a 100 kc. input signal received from said frequency standard, wherein said second frequency divider is set at a division factor of 1959 so that said controllable oscillator is controlled to generate a frequency of 1.959 mc., and wherein said third frequency divider is set at a division factor of 40 in order to develop an output frequency of 81.959 kc.

5. A frequency synthesizer arrangement in accordance with claim 3 wherein said first frequency divider is set to divide an input frequency of 100 kc. from said frequency standard by a division factor of 102, wherein said second frequency divider is set at a division factor of 2254 in order to establish the frequency of the controllable oscillator at 2.209804 . . . mc., and wherein said third frequency divider is set at a division factor of 45 in order to provide an output signal at a frequency of 81.96427 kc.

6. A frequency synthesizer arrangement in accordance with claim 3 wherein said first frequency divider is set at a division factor of 100 in order to provide a 1 kc. submultiple frequency from a 100 kc. input signal from said frequency standard, wherein said second frequency divider is selectively variable from a division factor of 1954 to one of 1964 in unit increment steps, and wherein said third divider is set at a division factor of 40 in order to provide an output frequency which is variable with the setting of the second frequency divider in one-cycle-per-second steps from 81.954 kc. to 81.964 kc.

7. A frequency synthesizer arrangement in accordance with claim 3 wherein said second frequency divider is variable over a predetermined range in order to provide an output frequency variable in one-cycle-per-second steps from 81.954 kc. to 81.964 kc.

References Cited by the Examiner

UNITED STATES PATENTS

| | | | |
|---|---|---|---|
| 2,581,594 | 1/1952 | MacSorley | 331—40 X |
| 2,627,033 | 1/1953 | Jensen et al. | 331—18 X |
| 2,813,977 | 11/1957 | Carter | 331—39 |
| 2,854,579 | 9/1958 | De Vrijer. | |
| 2,892,944 | 6/1959 | Wu | 331—37 |
| 2,957,144 | 10/1960 | Huhn | 331—40 |
| 3,023,370 | 2/1962 | Waller | 331—25 X |

FOREIGN PATENTS

| | | |
|---|---|---|
| 717,122 | 10/1954 | Great Britain. |

ROY LAKE, *Primary Examiner.*

NATHAN KAUFMAN, JOHN KOMINSKI, *Examiners.*

J. B. MULLINS, *Assistant Examiner.*